(12) United States Patent
Chan et al.

(10) Patent No.: US 7,144,769 B2
(45) Date of Patent: Dec. 5, 2006

(54) METHOD TO ACHIEVE INCREASED TRENCH DEPTH, INDEPENDENT OF CD AS DEFINED BY LITHOGRAPHY

(75) Inventors: Kevin K. Chan, Staten Island, NY (US); Subhash B. Kulkarni, Cortlandt Manor, NY (US); Gangadhara S. Mathad, Poughkeepsie, NY (US); Rajiv M. Ranade, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/899,758

(22) Filed: Jul. 27, 2004

(65) Prior Publication Data
US 2005/0009295 A1    Jan. 13, 2005

Related U.S. Application Data

(62) Division of application No. 10/093,789, filed on Mar. 7, 2002, now Pat. No. 6,821,864.

(51) Int. Cl.
*H01L 21/8242* (2006.01)
(52) U.S. Cl. ........................... 438/243; 257/301
(58) Field of Classification Search ............... 438/245, 438/269, 388, 429, 430, 243, 386; 257/301, 257/E27.092, E27.095, E29.346, E21.396, 257/E21.651
See application file for complete search history.

(56) References Cited

U.S. PATENT DOCUMENTS

| | | | |
|---|---|---|---|
| 4,843,025 A | 6/1989 | Morita | |
| 4,980,306 A | 12/1990 | Shimbo | |
| 5,308,785 A * | 5/1994 | Comfort et al. | 438/429 |
| 5,677,219 A | 10/1997 | Maxure et al. | |
| 5,933,748 A | 8/1999 | Chou et al. | |
| 5,945,704 A | 8/1999 | Schrems et al. | |
| 6,025,225 A | 2/2000 | Forbes et al. | |
| 6,144,054 A | 11/2000 | Agahi et al. | |
| 6,501,149 B1 * | 12/2002 | Hong | 257/510 |

FOREIGN PATENT DOCUMENTS

EP    0293134 A1    11/1988

OTHER PUBLICATIONS

R.S. Bennet, et al. Fabrication of Narrow elf-Aligned Trenches and Isolated N-type Silicon Region with Buried N+ Layer, IBM Disclosure Bulletin, vol. 34, No. 10A, 1992 (pp. 397-399).

* cited by examiner

*Primary Examiner*—David Vu
(74) *Attorney, Agent, or Firm*—Scully, Scott, Murphy & Presser, P.C.; Todd M. C. Li, Esq.

(57) ABSTRACT

A method of forming at least one deep trench structure having an increased trench depth is provided. The method includes providing at least one deep trench having sidewalls that extend to a common bottom wall in a surface of a substrate. Each deep trench has initial dimensions that are wider than targeted dimensions for the deep trenches. To reduce the initial dimensions to that of the targeted dimensions, an epitaxial silicon film is formed selectively or non-selectively on at least some portions of the sidewalls using a low-temperature ultra-high vacuum epitaxial silicon growth tehnique.

5 Claims, 7 Drawing Sheets

METHOD TO ACHIEVE INCREASED TRENCH DEPTH, INDEPENDENT OF CD AS DEFINED BY LITHOGRAPHY

RELATED APPLICATION

This application is a divisional of U.S. application Ser. No. 10/093,789, filed Mar. 7, 2002 now U.S. Pat. No. 6,821,864.

FIELD OF THE INVENTION

The present invention relates to semiconductor device manufacturing, and more particularly to a method of increasing the depth of a trench formed in a substrate which is independent of the critical deep trench mask dimensions as defined by lithography.

BACKGROUND OF THE INVENTION

A memory cell in an integrated circuit (IC) includes a transistor and an associated capacitor. The capacitor, which is typically formed in a portion of a trench, consists of a pair of conductive plates, i.e., electrodes, which are separated from each other by a node dielectric material. Information or data is stored in the memory cell in the form of charge accumulated on the capacitor. As the density of the ICs with memory cells is increased, the area for the capacitor becomes smaller and the amount of charge the capacitor is able to accumulate is reduced. Thus, with less charge to detect, reading the information or data from the memory cell becomes much more difficult.

With a limited fixed space or volume for the capacitor of a memory cell in a highly integrated circuit, there are three known techniques for increasing the amount of charge within a fixed space or area. These three known techniques include: (1) decreasing the thickness of the dielectric material, i.e., node dielectric, that is located between the capacitor plates; (2) changing the dielectric material to one with a relative dielectric constant higher than $SiO_2$ or $Si_3N_4$; or (3) increasing the surface area of the space to be used for housing the capacitor.

Of the above mentioned techniques, solution (3) is most viable because the other two solutions have several drawbacks associated therewith which limit their use. For example, solution (1), which thins the capacitor dielectric, also increases leakage currents that may affect the memory retention performance of the capacitor and the reliability of the memory cell. Solution (2), which purports to change the dielectric material to a higher-dielectric constant material, will only cause a slight improvement in charge storage because the dielectric constant of suitable alternative dielectrics is only slightly higher than the dielectric material currently being used. Moreover, the substitution of alternative dielectrics may be more complicated, more expensive and provide fabrication problems that are heretofore unknown.

Accordingly, solution (3), i.e., increasing the surface area of the space to be used for the capacitor, provides the most promise for substantially improving the amount of charge stored without causing any of the problems mentioned for solutions (1) and (2).

One previous solution to increase the surface area of the capacitor is to replace common stack capacitor technology with trench capacitors. In common stack capacitor technology, the capacitor is built on a surface created on a semiconductor substrate. In trench capacitor technology, the capacitor is formed in a trench that is fabricated in a semiconductor substrate itself. An increase in depth of the trench, increases the surface area of the capacitor. However, the depth of the trench is limited by present fabrication methods and tools.

Moreover, as the critical dimensions shrink, it becomes more and more difficult to achieve deep trench (DT) structures that would fulfill the cell capacitance requirements for a given generation device. The difficulty of fulfilling cell capacitance requirements is due to severe reactive-ion etching (RIE) lag effects, which are caused using prior art processes. RIE requires reactive ions to reach the bottom of the trench. RIE becomes increasingly difficult when high aspect ratio trenches (greater than 10) are required.

The term "aspect ratio" denotes the ratio between the depth (i.e., height) of the trench and the width of the trench opening.

U.S. Pat. No. 6,025,225 to Forbes, et al. as well as the various references cited therein define the above problem of increasing the surface area of the capacitor in memory cell structures and provide solutions for obviating the same. For example, in the Forbes, et al. disclosure the sidewalls of the etched trench have been roughened. The process disclosed in Forbes, et al. includes deposition of amorphous Si on the trench sidewalls.

U.S. Pat. No. 4,843,025 to Morita, et al. provide a method to form narrow, loop-shaped trenches by (i) depositing epitaxial Si on the bottom of a very wide, rectangular trench; (ii) forming an oxide film on the trench walls of the same thickness as the trench width to be subsequently fabricated; and (iii) etching trenches to leave a narrow moat-like trench.

IBM Technical Disclosure Bulletin VOL. 34, No. 10A, March 1992 to R. S. Bennet, et al. disclose a method of fabricating narrow self-aligned trenches and isolated N-type Si regions with a buried N+ layer. In this disclosure, epitaxial Si, which is grown by conventional procedures, is used over trench dimensions that have an aspect ratio of 1.0.

In view of the above drawbacks with prior art methods for fabricating DT structures, there is a continued need for providing a new and improved method that is capable of forming deep trenches that are independent of the critical DT mask dimensions as defined by lithography. Such a method is especially needed for providing high aspect ratio trenches whose height to width ratio is greater than 10.

SUMMARY OF THE INVENTION

One object of the present invention relates to a method of fabricating at least one deep trench structure in a surface of a substrate.

Another object of the present invention is to provide a method for fabricating at least one deep trench structure that fulfills the cell capacitance requirements for a given generation of device.

A further object of the present invention is to provide a method for fabricating at least one deep trench structure whose depth is independent of critical DT mask dimensions.

An even further object of the present invention is to provide a method of fabricating at least one deep trench structure which employs processing steps that are compatible with existing trench capacitor technology.

A still further object of the present invention is to provide a method of fabricating a high aspect ratio trench wherein the ratio of the height of the trench to the width of the trench opening is greater than 10.

A yet further object of the present invention is to provide a method of fabricating a deep trench wherein the trench is lined with a material that is capable of providing a trench that has rounded corner regions that are not pinched-off.

These and other objects and advantages are achieved by providing at least one deep trench with a critical dimension (CD) that is wider than the design value (RIE lag is less at wider CDs) and then reducing the trench CD to the design value by forming a non-selective or selective epitaxial silicon film along portions of the trench walls.

Specifically, the method of the present invention comprises the steps of:

providing at least one deep trench having sidewalls that extend to a common bottom wall in a surface of a substrate, each of said at least one deep trenches having initial dimensions that are wider than targeted dimensions for said deep trenches; and forming an epitaxial silicon film on at least some portions of said sidewalls so as to reduce the initial dimensions of said deep trenches to the targeted dimensions.

It is noted that the term "deep trenches" is used in the present invention to denote trenches that have a depth, as measured from the upper surface of the substrate, of from about 5 to about 15μm, more particularly, from about 7 to about 12μm.

DETAILED DESCRIPTION OF THE INVENTION

Figure 1:
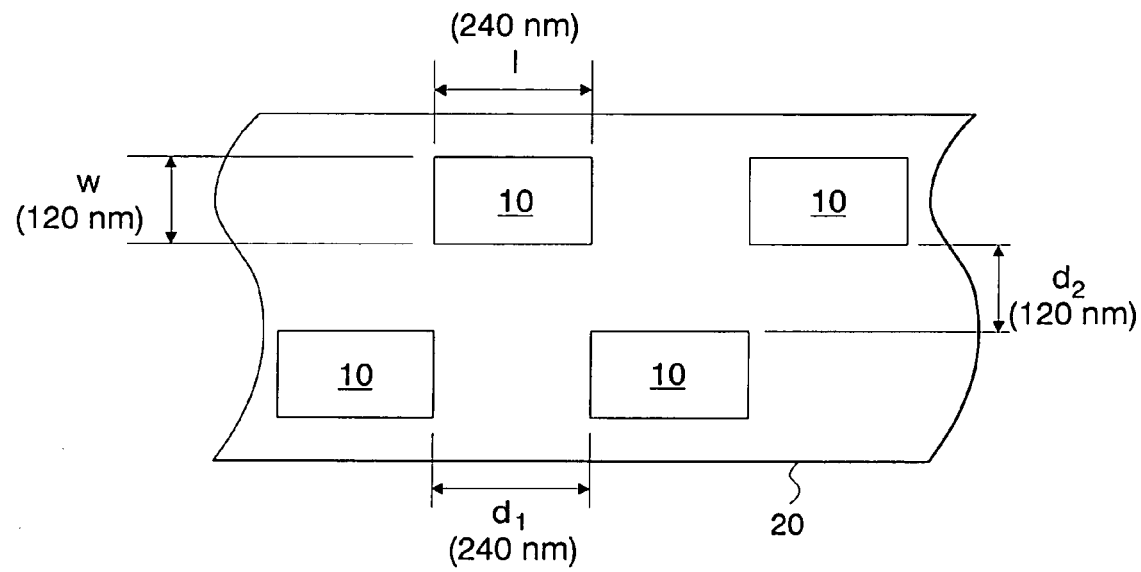
FIG. 1 is a pictorial representation of one possible deep trench cell layout.

The present invention, which provides a method of fabricating at least one deep trench structure in a substrate whose depth is independent of critical DT mask dimensions, will now be described in greater detail by referring to the drawings that accompany the present application.

As stated above, the present invention provides a method for forming at least one deep trench structure in a surface of a substrate whose depth is achieved independent of critical DT mask dimensions. This objective is achieved by first forming at least one deep trench having a critical dimension (width and length) that is wider than the design dimension (i.e., final targeted dimension).

Reference is made to FIG. 1 which illustrates one potential targeted cell layout that can be achieved using the processing steps of the present invention. In this figure, each targeted deep trench is represented by reference numeral 10. The dimensions of each deep trench, length, l, and width, w, is shown in this figure. The distance between each cell in a given row, $d_1$, and the distance between cells in one row and a neighboring row, $d_2$, are also shown in this figure. It is noted that the dimensions of l=240 nm, w=120 nm, $d_1$=240 nm, and $d_2$=120 nm are exemplary and that the present invention is not limited to only those dimensions. Rather, the present invention contemplates other dimensions for cell layouts which are currently employed in the semiconductor industry as well as other dimensions that may be employed in future cell layouts.

Figure 2:
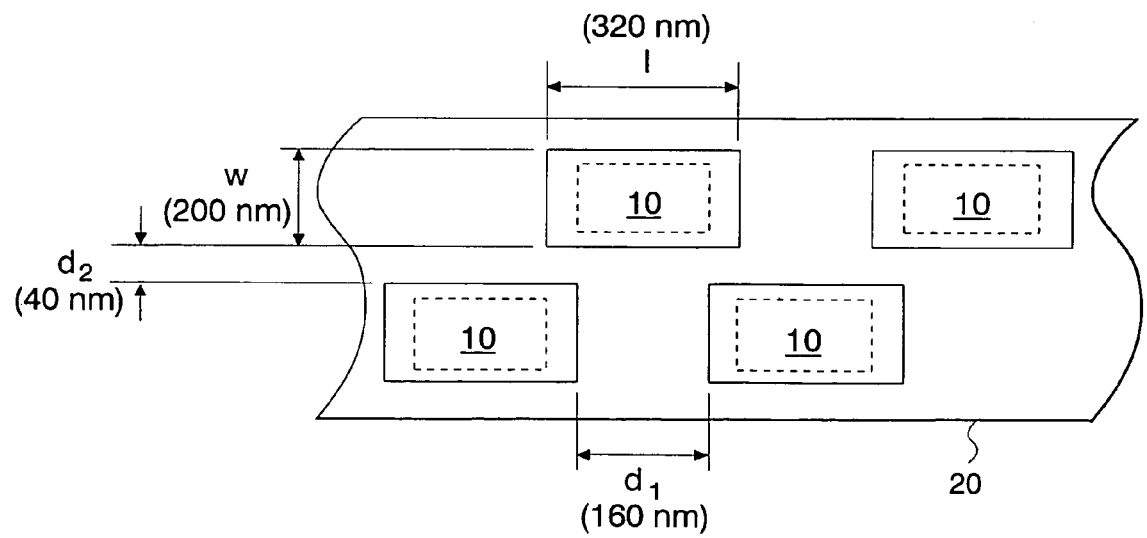
FIG. 2 is a pictorial representation of the deep trench cell layout of FIG. 1 after proper mask biasing.

To achieve the targeted cell layout shown in FIG. 1, the present invention increases the critical dimensions of each deep trench as shown by the solid lines in FIG. 2 by appropriately biasing the deep trench mask without merging the trenches; the dotted lines in this figure represent the targeted deep trench structures. Note that in FIG. 2 the critical dimensions of each deep trench mask is wider than the dimensions of the final targeted deep trench cell layout shown in FIG. 1. In the example illustrated, the dimensions of each deep trench mask have been increased to 200 nm by 320 nm.

After providing the initial deep trench structure having the wide CDs, the critical dimension of each deep trench is reduced by forming an epitaxial silicon film (selective or non-selective) along at least some portions of the trench walls.

Figure 3A:
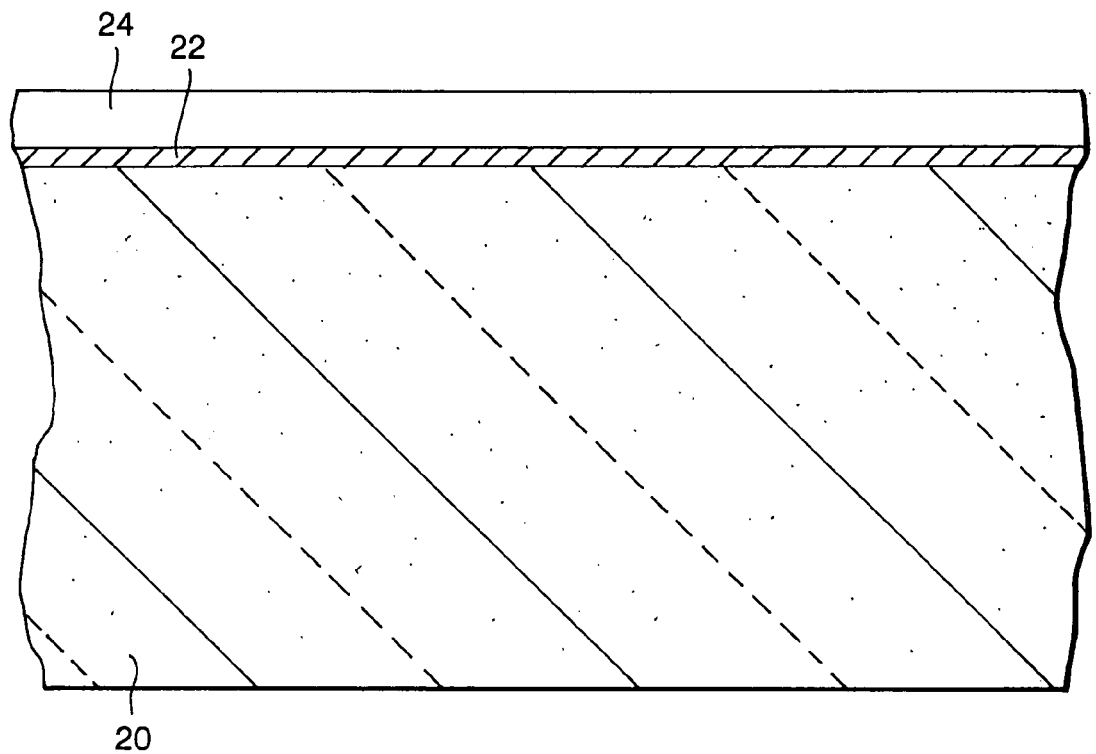
FIGS. 3A–3E are pictorial representations through cross-sectional views showing the basic processing steps employed in a first embodiment of the present invention.
Figure 3B:
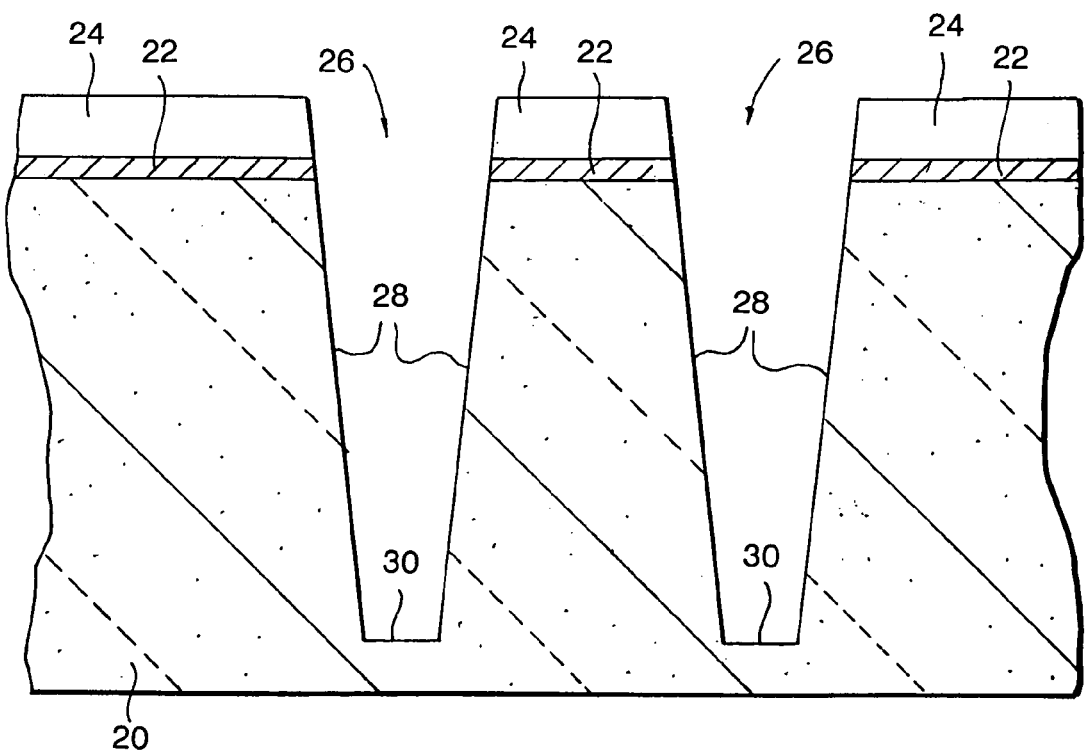
Figure 3C:
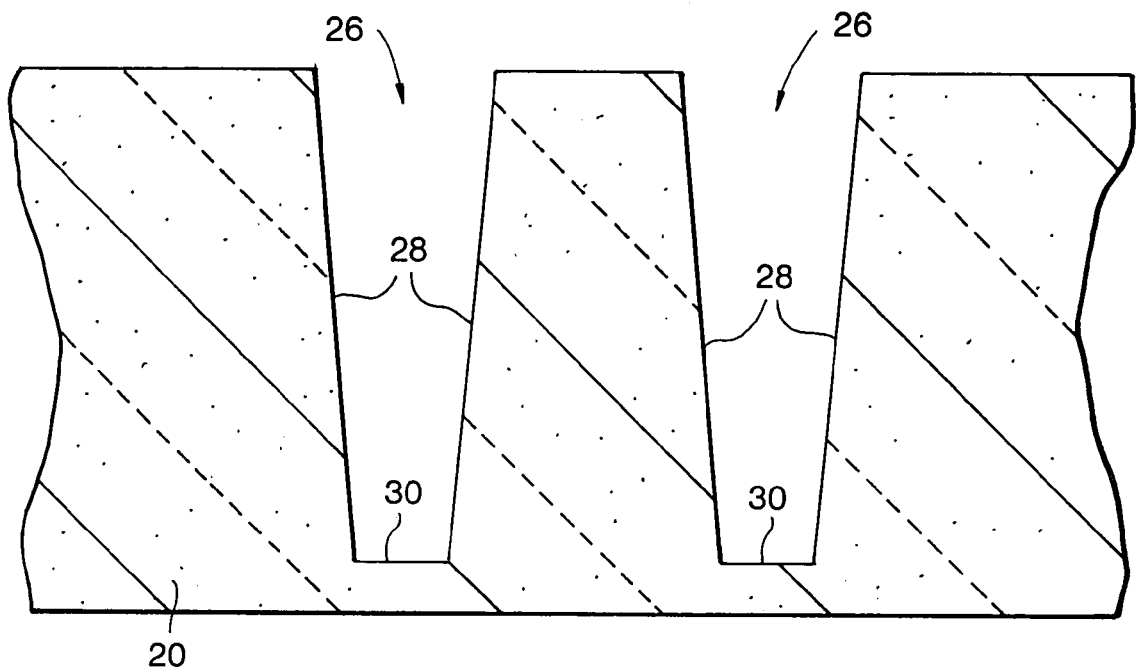

The above basic processing steps will be further described in conjunction with the following three embodiments. Reference is first made to FIGS. 3A–3E which illustrate the first embodiment of the present invention. Specifically, FIG. 3A shows an initial structure that is employed in the present invention. The initial structure shown in FIG. 3A comprises substrate 20, pad layer 22 present atop a surface of substrate 20 and mask 24 present atop pad layer 22. The structure shown in FIG. 3A is fabricated using conventional processing steps that are well known to those skilled in the art and the illustrated structure includes conventional materials that are also well known to those skilled in the art.

For example, substrate 20 comprises any semiconducting material including, but not limited to: Si, Ge, SiGe, GaAs, InAs, InP and all other III/V semiconductor compounds. Layered substrates containing the same or different semiconducting material such as Si/SiGe, and silicon-on-insulators (SOIs) are also contemplated herein. The substrate may be of the n-type or the p-type depending on the desired device to be fabricated. The substrate may also contain active device regions, wiring regions, isolation regions or other like regions therein. For clarity, these regions are not shown in the drawings, but are nevertheless intended to be included within region 20.

Pad layer 22 is then formed atop substrate 20 utilizing a conventional deposition process such as chemical vapor deposition (CVD), plasma-assisted CVD, and chemical solution deposition. Alternatively, pad layer 22 may be formed utilizing a thermal growing process including, but not limited to: oxidation, nitridation, oxynitridation, or any combination thereof. The present invention also contemplates the formation of pad layer 22 using a combination of deposition and thermal growing. Pad layer 22, which may include a single layer or multilayers, is comprised of an oxide, nitride, oxynitride or a combination thereof, e.g., an oxide/nitride multilayer pad structure. The thickness of pad layer 22 may vary and is not critical to the present invention. Typically, however, pad layer 22 has a thickness of from about 10 to about 150 nm, with a thickness of from about 50 to about 100 nm being more highly preferred.

Mask 24, which is composed of a silicate glass material such as boron doped silicate glass (BSG) and boron-phosphorus doped silicate glass (BPSG), is then formed atop pad layer 22 utilizing a conventional deposition process such as CVD, plasma-assisted CVD, evaporation, or spin-on coating. The thickness of mask 24 may vary and is not critical to the present invention. Typically, however, mask 24 has a thickness of from about 600 to about 3000 nm, with a thickness of from about 1000 to about 2000 nm being more highly preferred.

A second mask, not shown, containing a trench pattern such as shown by the solid lines in FIG. 2, in which the critical dimensions are wider than the final targeted deep trench pattern such as shown in FIG. 1, is then formed atop mask 24 utilizing conventional lithography. The trench pattern from the second mask which has the wide critical dimensions is then transferred into mask 24 and pad layer 22 utilizing one or more conventional etching processes that are highly selectively in removing exposed silicate glass mask 24 and pad layer 22 from the structure. Suitable etching processes that may be employed at this point of the present invention include reactive-ion etching, plasma etching, ion beam etching, laser ablation or any combination thereof.

During this step of the present invention, portions of mask 24 and pad layer 22 are removed exposing the underlying substrate. After opening mask 24 and pad layer 22, the exposed portions of substrate 20 are then selectively etched utilizing a timed etching process that is highly selective in removing some of the exposed portions of substrate 20 and thereafter the mask containing the pattern such as shown in FIG. 2 is removed utilizing a conventional stripping process well known to those skilled in the art. The resultant structure, including deep trenches 26, which are formed after the above patterning and etching steps have been performed, is shown, for example, in FIG. 3B.

Note that deep trenches 26 have sidewalls 28 which extend to common bottom wall 30. Some tapering of the sidewalls may occur such that the sidewalls are not perfectly vertical. The deep trenches also have critical dimensions matching that shown in FIG. 2, i.e., critical dimensions that are wider than the targeted dimensions of the final trench structure. Because of the larger critical dimensions, deeper trenches are achieved for a given thickness of mask 24.

After trench etching, mask 24 is removed from the structure utilizing any conventional stripping process which selectively removes mask material 24 as compared to either pad material or substrate. The pad layer may then be removed utilizing a conventional etching process that is highly selective for removing pad material from the structure. For example, when pad layer 22 is comprised of an oxide, buffered-HF may be employed as the chemical etchant. The resultant structure that is formed after removing mask 24 and pad layer 22 is shown, for example, in FIG. 3C.

Any bare surfaces of substrate 20 may, if required, be cleaned prior to proceeding to the next step of the present invention. The optional cleaning step is performed utilizing techniques well known to those skilled in the art. For example, the exposed surfaces of substrate 20 may be cleaned using RCA clean.

Figure 3D:
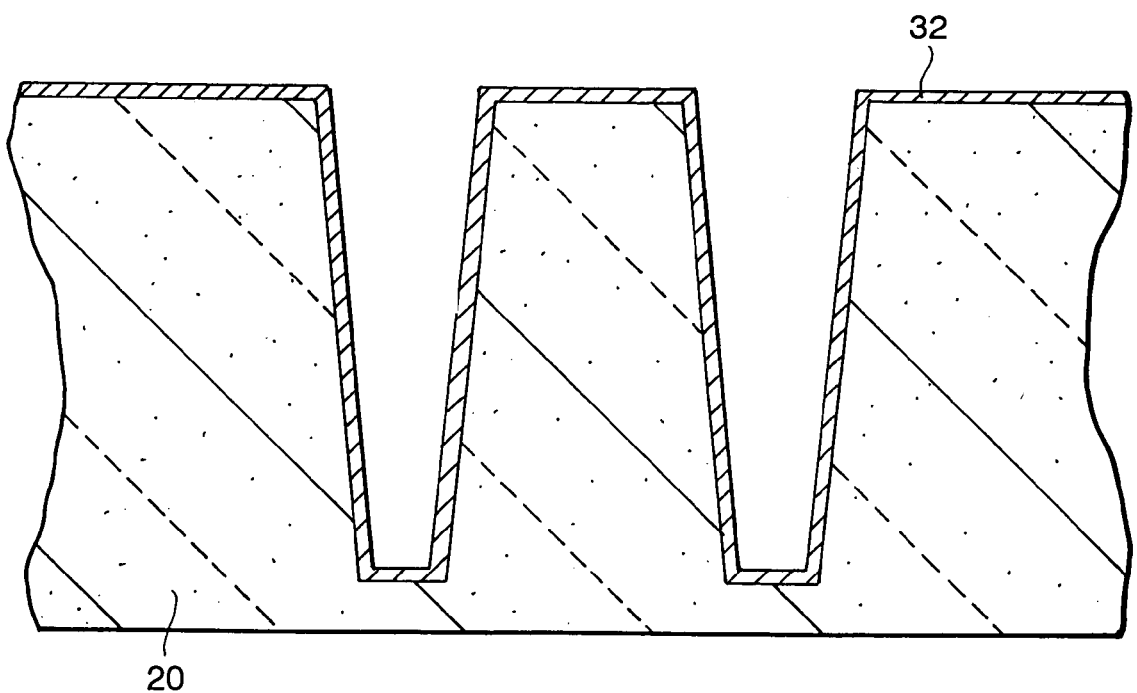

Next, epitaxial silicon (i.e., epi-Si) film 32 is formed on all bare surfaces of the substrate including on the sidewalls and bottom wall of each deep trench so as to provide the structure illustrated in FIG. 3D. The epitaxial silicon film reduces the critical dimensions of each trench so as to provide deep trenches having dimensions that substantially match the final targeted value (dotted line in FIG. 2). Also, the deep trenches formed at this point of the present invention will have a high-aspect ratio (of greater than 10) associated therewith.

In this embodiment, the epitaxial silicon film is formed using a low-temperature (less than 900° C.), ultra-high vacuum (UHV) non-selective epitaxial process such as described, for example, in "Silicon Epitaxy by Low Tem perature UHV-CVD: AFM Study of Initial Stages of Growth", J. of Crystal Growth, 159 (1995) p. 161–167. Conventional high-temperature epitaxial silicon deposition processes using radiantly-heated barrel reactors or rapid thermal CVD typical do not work well because they result in epi Si films that pinch-off the trenches. Pinching-off the trenches is caused by faster growth rates on certain crystallographic planes. The low-temperature UHV epitaxial growth process employed in the present invention provides a uniform conformal coating on the sidewalls of the trenches which eliminates the pinch-off effect observed with conventional high-temperature epitaxial growth processes.

The low-temperature UHV epitaxial deposition process employed in the present invention may be carried out at a pressure of from about 0.05 to about 1 torr, and at a temperature of from about 500° to about 850° C. The growth rate of epi Si film 32 using the above conditions is from about 1 to about 100 Å/min.

The thickness of the epitaxial silicon film formed at this point of the present invention may vary depending on the process used in forming the same. Typically, epitaxial silicon film 32 has a thickness of from about 10 to about 100 nm, with a thickness of from about 30 to about 60 nm being more highly preferred.

In some embodiments, a slight overhang of epi Si film 32 may be present at the top corners of each deep trench. In such cases where there is a slight overhang of epitaxial silicon film 32 at the corners of the deep trench, a short reactive-ion etch in a halogenated plasma, such as a fluorinated plasma, may be used to preferentially etch the overhang of epitaxial silicon film and straighten out the sidewalls of the epitaxial silicon film.

Figure 3E:
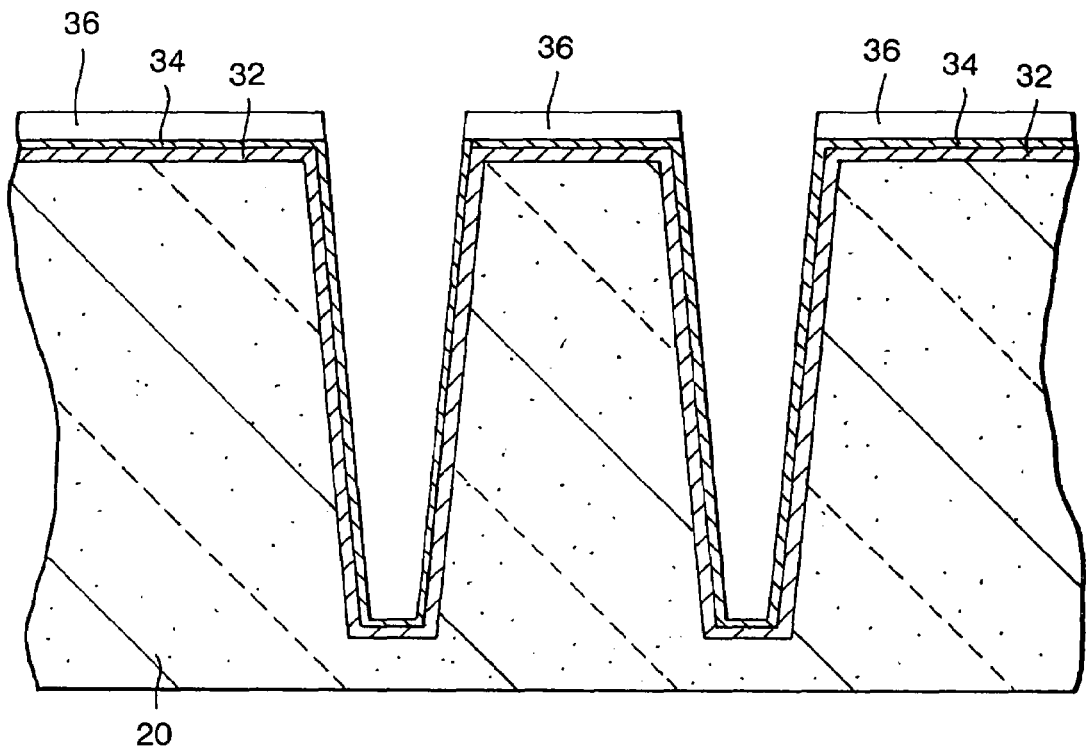

To continue further in producing a capacitor inside each deep trench containing the epitaxial silicon film, epitaxial silicon film 32 is then passivated by forming pad oxide layer 34 thereon. Pad oxide 34 is formed using a conventional thermal oxidation process. The thickness of pad oxide layer 34 may vary and is not critical to the present invention. Next, thin nitride film 36 having a thickness of about 1.0 to about 20 nm is deposited atop pad oxide layer 34 using a conventional deposition process such as high-density plasma deposition. The thin nitride layer present within the interior of each deep trench may be removed using a conventional wet etching process that is highly selective in removing nitride. The resultant structure, which is ready for conventional down-stream processes such as resist and polysilicon recesses as well as trench capacitor formation, is shown in FIG. 3E.

Figure 4A:
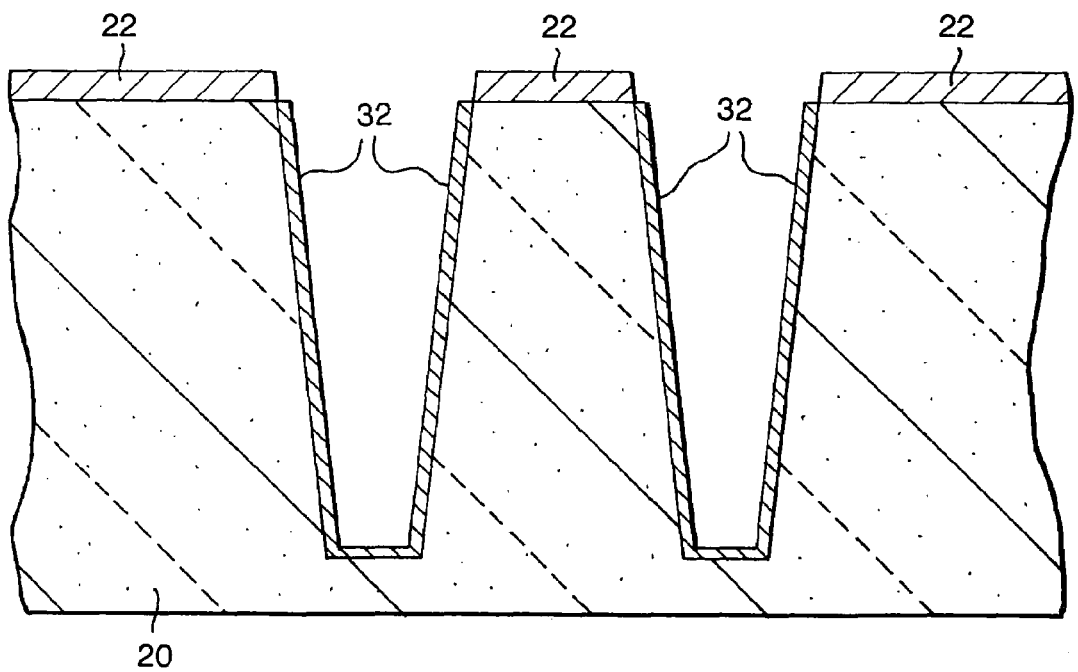
FIGS. 4A–4B are pictorial representations through cross-sectional views showing the basic processing steps employed in a second embodiment of the present invention.
Figure 4B:
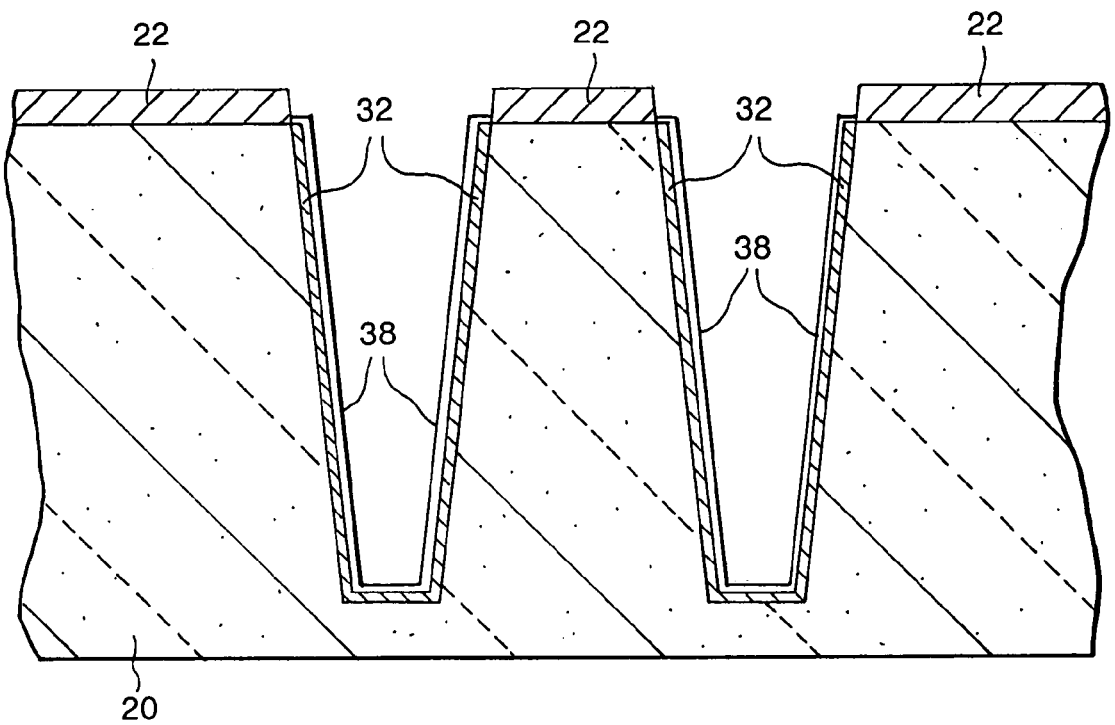

Reference is now made to FIGS. 4A–4B which illustrate a second embodiment of the present invention. In the second embodiment of the present invention, the structures shown in FIGS. 3A and 3B above are employed. That is, a structure including substrate 20, pad layer 22 and silicate glass mask 24 is first formed using the processes mentioned above. In the second embodiment, pad layer 22 is a stack comprising a layer of nitride formed atop a layer of oxide, i.e., an oxide/nitride stack.

A second mask having larger critical dimensions such as shown in FIG. 2 is then used and etching is performed as described above to provide the deep trenches having wider critical dimensions into substrate 20. The second mask is removed and then silicate glass mask 24 is removed from the structure using a conventional chemical etchant such as buffered HF. With pad layer 22 in place, bare surfaces of substrate 20 may be cleaned as discussed above and thereafter epitaxial silicon film 32 is formed on any bare substrate surfaces providing the structure shown, for example, in FIG.

4A. In this embodiment, epitaxial silicon film 32 is formed using a selective low-temperature ultra-high vacuum CVD epitaxial growth process where silicon growth occurs only on the exposed silicon surfaces of the substrate. The above mentioned low-temperature UHV parameters may be used in this embodiment of the present invention as well.

Next, and as shown in FIG. 4B, a thermal silicon dioxide film (labeled as 38) is formed atop pad layer 22 as well as the epitaxial silicon film grown within each deep trench. The thermal silicon dioxide film is formed using a conventional thermal growing process well known to those skilled in the art. The thickness of the thermally grown silicon dioxide film may vary and is not critical to the present invention. This structure is then available for conventional downstream processes such as poly buffered LOCOS (local oxidation of silicon), polysilicon recess, and etc, as well as conventional trench capacitor formation.

Reference is now made to FIGS. 5A–5D which illustrate a third embodiment of the present invention. In the third embodiment of the present invention, the structures shown in FIGS. 3A and 3B above are employed. That is, a structure including substrate 20, pad layer 22 and silicate glass mask 24 is first formed using the processes mentioned above. In the third embodiment, pad layer 22 is an oxide/nitride stack.

A second mask having larger critical dimensions such as shown in FIG. 2 is then used and etching is performed as described above to provide the deep trenches having wider critical dimensions into substrate 20. The second mask is removed and then silicate glass mask 24 is removed from the structure using a conventional chemical etchant such as buffered HF. With pad layer 22 in place, bare surfaces of substrate 20 may be cleaned as discussed above.

Figure 5A:
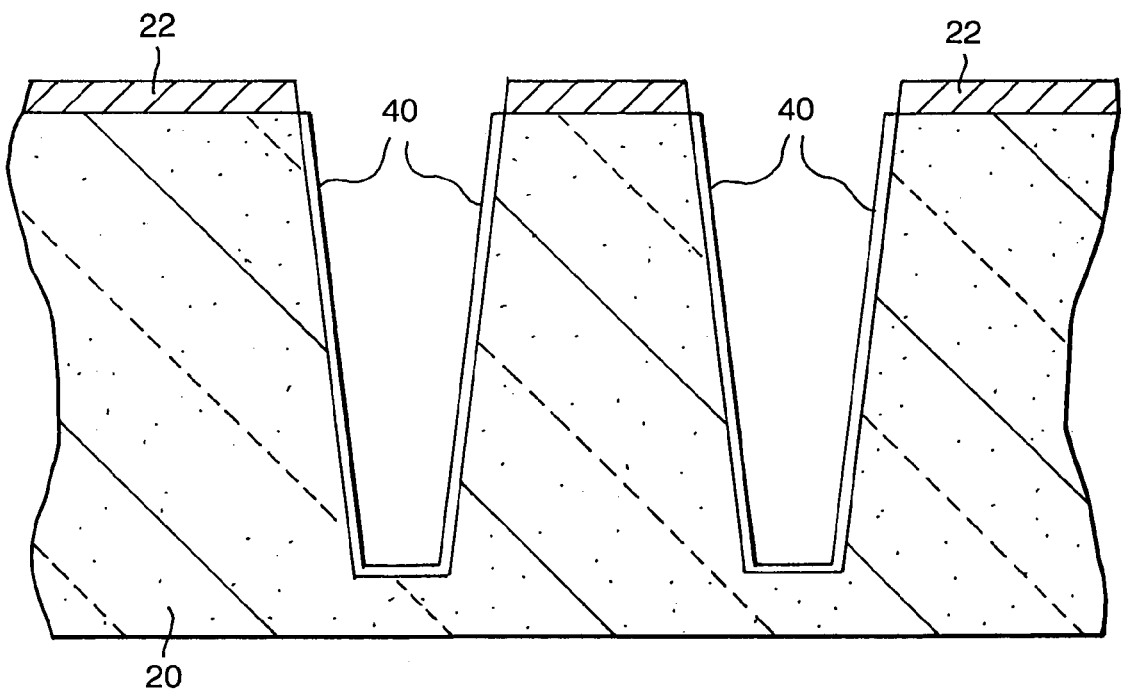
FIGS. 5A–5D are pictorial representations through cross-sectional views showing the basic processing steps employed in a third embodiment of the present invention.
Figure 5B:
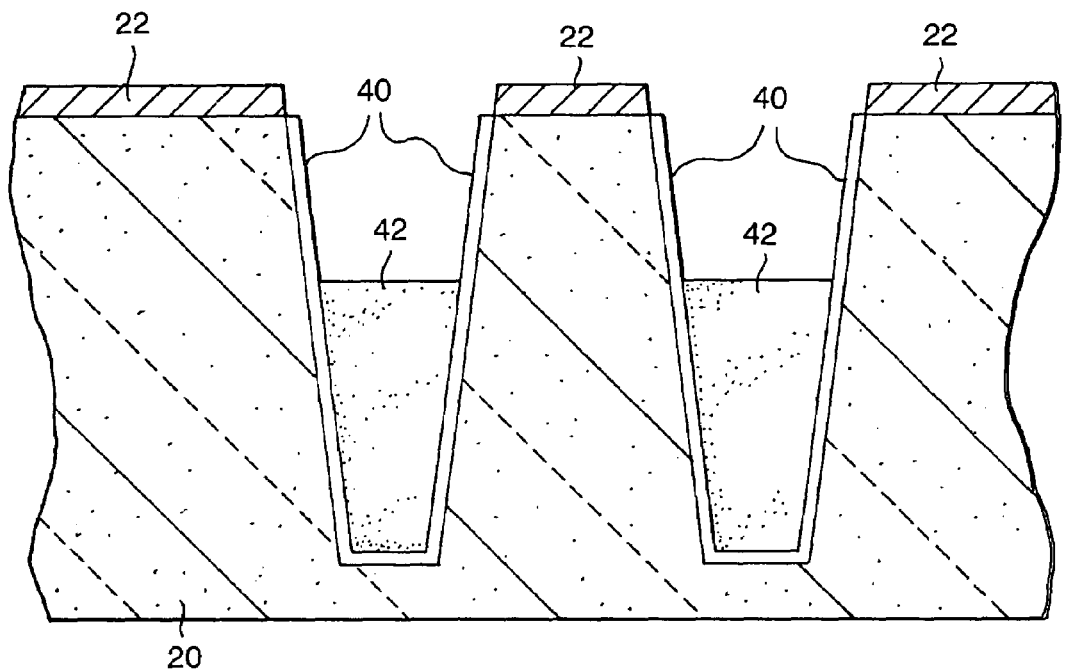

In accordance with the third embodiment of the present invention, selective epitaxial silicon film 32 is formed only on upper sidewalls of each deep trench where device connections, such as buried straps, are later fabricated, leaving the bottom portion of the trench untouched. To achieve formation of the epitaxial silicon film on the upper sidewalls of each deep trench, liner 40 is formed on the exposed surfaces of substrate 20 within each deep trench structure using a conventional thermal growing process, a conventional deposition process or a combination thereof. Liner 40 may be composed of an oxide (formed by thermal oxidation) or an oxide/nitride stack (formed by thermal oxidation and deposition of a nitride layer). The structure including liner 40 is shown in FIG. 5A.

Each deep trench containing liner 40 is then filled with resist material 42 using a conventional deposition process and thereafter a recessed etching process is employed to remove portions of resist material 42 from the upper portion of each deep trench. The structure including recessed resist material 42 is shown, for example, in FIG. 5B.

Figure 5C:
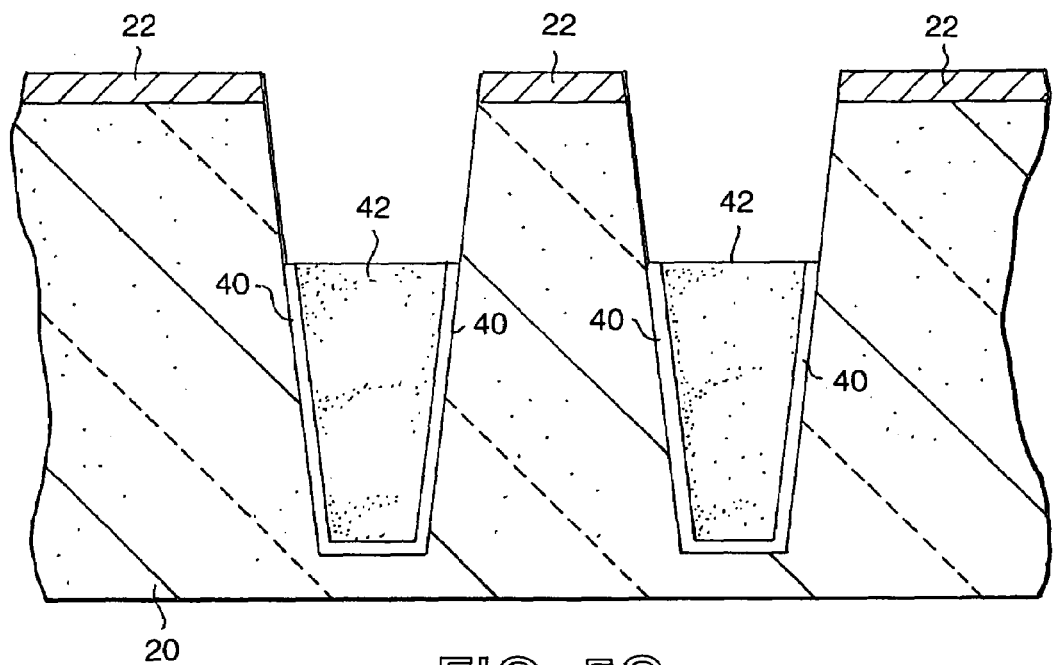

Next, and as shown in FIG. 5C, the exposed liner from the upper portion of each deep trench not protected by the recessed resist material is removed using a selective chemical etching process so as to expose upper portions of the sidewalls of each deep trench. The photoresist material 42 is then removed using a conventional chemical stripping process.

Figure 5D:
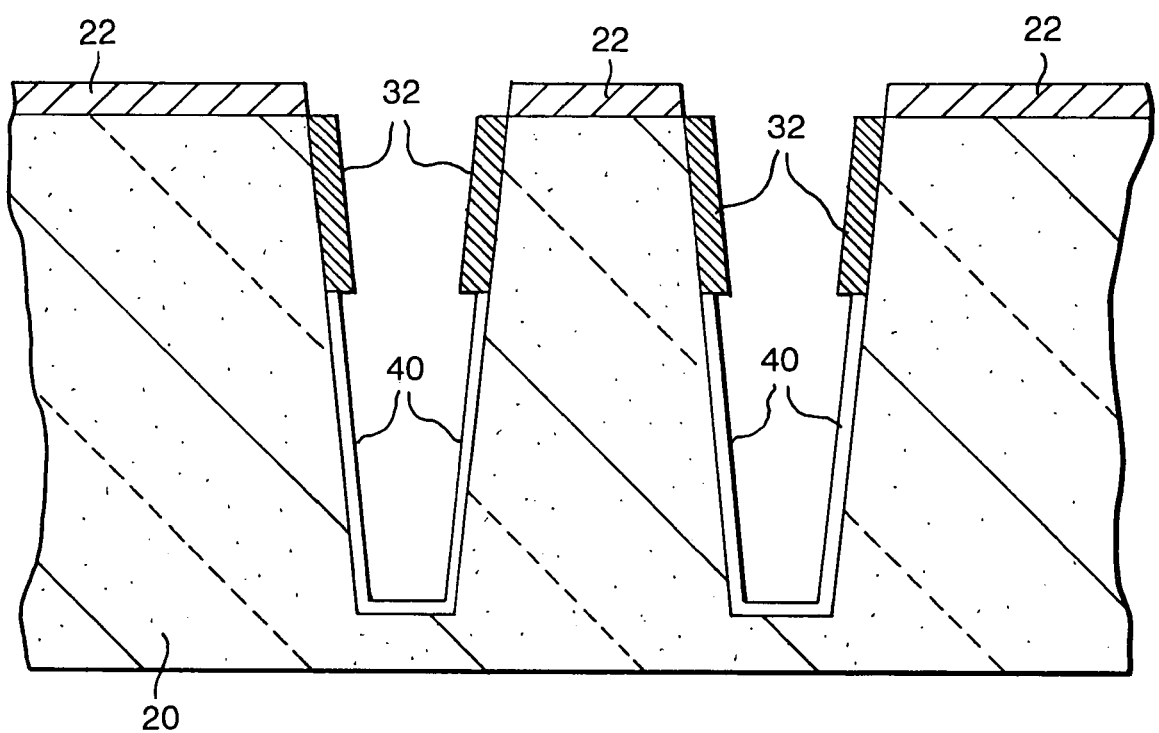

A controlled UHV selective epitaxial silicon growth process is then employed to form epitaxial silicon film 32 on the exposed upper portions of each deep trench. The above-mentioned low-temperature UHV parameters may be also be employed in this embodiment of the present invention. The resultant structure is shown in FIG. 5D. Note that in this embodiment the critical dimension reduction occurs only on the top part of each trench. The lower portion of the each deep trench retains the wider critical dimensions thereby further enhancing the cell area and therefore the cell capacitance.

The implications of the inventive method on memory cell capacitance will now be discussed. Because cell capacitance is directly proportional to trench depth and circumference (for a given node dielectric film), the present invention achieves higher capacitance values due to larger depths as in the first and second embodiments or even higher values due to larger depth and circumferences as in the third embodiment. In accordance with the present invention, memory cells containing the deep trenches fabricated above will have a capacitance of about 50 fF or greater.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

Having thus described our invention in detail, what we claim as new and desire to secure by the Letters Patent is:

1. A method of forming one or more deep trench structures comprising the steps of:
   providing one or more deep trenches having sidewalls that extend to a common bottom wall in a surface of a substrate, each of said one or more deep trenches having initial dimensions that are wider than targeted dimensions for said deep trenches; and
   forming an epitaxial silicon film only on upper portions of said sidewalls so as to reduce the initial dimensions of said deep trenches to the targeted dimensions, wherein said epitaxial silicon film is formed utilizing a selective low-temperature ultra-high vacuum (UHV) epitaxial silicon growth process.

2. A method of forming one or more deep trench structures, said method comprising the steps of:
   providing one or more deep trenches having sidewalls that extend to a common bottom wall in a surface of a substrate, each of said one or more deep trenches having initial dimensions that are wider than targeted dimensions for said deep trenches, said substrate having an upper surface which includes at least a pad material present thereon;
   forming an epitaxial silicon film only on upper portions of said sidewalls so as to reduce the initial dimensions of said deep trenches to the targeted dimensions; and
   forming a silicon dioxide film on said epitaxial silicon film.

3. The method of claim 2 wherein said epitaxial silicon film is formed by a selective low-temperature UHV epitaxial growth process.

4. The method of claim 3 wherein said low-temperature UHV process is carried out at a pressure of from about 0.05 to about 1.0 torr and at a temperature of from about 500° C. to about 850° C.

5. The method of claim 2 wherein the one or more deep trenches formed each have a height-to-width ratio of greater than 10.

* * * * *